United States Patent

Gurtler et al.

[15] 3,699,407

[45] Oct. 17, 1972

[54] ELECTRO-OPTICAL COUPLED-PAIR USING A SCHOTTKY BARRIER DIODE DETECTOR

[72] Inventors: Richard W. Gurtler, Mesa; Jack L. Saltich, Scottsdale, both of Ariz.

[73] Assignee: Motorola, Inc., Franklin Park, Ill.

[22] Filed: Sept. 29, 1971

[21] Appl. No.: 184,819

[52] U.S. Cl. .....317/235 R, 317/235 N, 317/235 VA, 317/235 AJ, 250/211 J

[51] Int. Cl. .......................................H01l 15/00

[58] Field of Search.......317/235 VA, 235 N, 235 AJ

[56] References Cited

UNITED STATES PATENTS

| | | | |
|---|---|---|---|
| 3,622,844 | 11/1971 | Barrelli | 317/234 |
| 3,598,997 | 8/1971 | Baertsch | 250/83 |
| 3,435,236 | 3/1969 | Love et al. | 250/211 |
| 3,452,204 | 6/1969 | Love et al. | 250/211 |
| 3,560,812 | 2/1971 | Hall | 317/234 |
| 3,582,656 | 6/1971 | Koehler | 250/83.3 |
| 3,615,853 | 10/1971 | Paine | 136/89 |

FOREIGN PATENTS OR APPLICATIONS

| | | | |
|---|---|---|---|
| 1,139,495 | 1/1969 | Great Britain | 317/235 VA |

*Primary Examiner*—Martin H. Edlow
*Attorney*—Foorman L. Mueller et al.

[57] ABSTRACT

There is disclosed an electro-optical coupled pair utilizing a Schottky barrier diode detector in combination with a light source in which in the preferred embodiment the bottom portion of the Schottky barrier diode is hollowed out by anisotropically etching the wafer used for the diode to provide the hollowed-out portion with smooth inclined sidewalls over the light source for coupling light generated laterally into the wafer. Because of the anisotropic etching, the sidewalls serve to couple a much greater percentage of the generated light into the diode to produce more electron-hole pairs, and therefore more external signal. This configuration thus captures non-vertically generated light which would otherwise be lost, thus increasing the efficiency of Schottky diode detectors and the coupled pair.

9 Claims, 7 Drawing Figures

ELECTRO-OPTICAL COUPLED-PAIR USING A SCHOTTKY BARRIER DIODE DETECTOR

BACKGROUND OF THE INVENTION

This invention relates to optically coupled pairs and more particularly to the use of a hollowed-out Schottky barrier diode detector for the coupled pairs.

A coupled pair is defined to be an electrically driven light source and a light detecting device with some sort of coupling member therebetween, be it air or some other structure. The structure provided herein is part of a Schottky barrier diode detector and is a hollowed-out silicon wafer. The structure is hollowed out for two reasons. First, the active region of the device is made to be on the order of 25 microns thick, the optimal distance for absorption of photons from a GaAs light emitting diode. Secondly, the hollowed-out structure surrounds the light source such that the energy from non-vertically directed photons can be absorbed. Non-vertically generated light is characteristic of many light sources used for coupled pairs. Such a source is a light emitting diode which emits light isotropically or nearly so. This means that in addition to light emitted vertically, there is a considerable horizontal emission. One such diode is the gallium arsenide light emitting diode. Normally much of the isotropically emitted light is lost in a coupled pair. However, by partially surrounding the diode with the Schottky barrier detector, much of this "lost" light is recaptured. The Schottky barrier diode is chosen as the detector because of its simplicity, involving no diffused junctions, and because all contacts can be made to its top surface.

Although the subject device is a combined structure involving a light source and a detector in which the hollowed-out part of the detector can be formed by etching, drilling or grinding and the like, the preferred embodiment utilizes anisotropic etching of the silicon wafer.

Anisotropic etching of <100> silicon is anisotropically etched, apertures formed in the silicon wafer have inclined sidewalls. The surfaces of these sidewalls when oriented in a particular direction with respect to incoming light couple the incoming light into the silicon wafer because of their smooth surfaces. In the process of anisotropically etching a wafer having a <100> crystallographic orientation it has also been found, because of the slow etching rate that etching depth and pattern definition can be controlled to such an extent that a very thin active region for the detector can be formed and that hollowed-out regions can be formed at closely packed locations in the wafer. The combination of the light coupling afforded by the smooth inclined sidewalls, along with the precision of the anisotropic etching permits the use of an appropriately etched and isolated silicon wafer as part of the Schottky diode detectors used for a closely packed array of optically coupled pairs.

In high density coupled-pair arrays cutting and grinding a coupling member having optically smooth accurately positioned inclined sidewall apertures would be extremely difficult. However, by standard photolithographic masking and etching techniques, inclined sidewalls can be accurately located in a silicon wafer, with the hollowed-out regions having sizes which correspond almost exactly to the size of the light emitting element. It is the accuracy of the rather slow anisotropic etching process which permits control over the size, depth and position of each of the hollowed-out regions such that the etched wafer may be utilized in high density electro-optical coupled-pair arrays.

The first mentioned function of optical coupling at the inclined sidewalls of the hollowed-out structures finds application in reducing the power necessary to drive electro-optical coupled-pair circuits. When light emitting diodes are utilized in combination with an inclined sidewall detector, it is possible to reduce the power to the light emitting diodes because the efficiency of each detector diode is increased by capturing stray light from the light emitting diode. This permits a sandwich structure in which appropriately positioned hollowed-out regions provide a direct optical coupling between source and detector. This increases the efficiency of coupled-pairs having conventional Schottky barrier diode detectors by more than 50 percent.

It will be appreciated that in the anisotropically etching of silicon if the mask used in fabrication of the devices is provided with square apertures, the hollowed-out regions in the silicon wafer therebeneath are in the form of truncated pyramids when the wafer is anisotropically etched by, for instance, a hot potassium hydroxide solution.

There is provided therefor an optically coupled pair arrangement in which a light source is optically coupled to a detector not only through its active region but also through surrounding sidewalls into which is coupled isotropically emitted light. In the preferred embodiment this detector is anisotropically etched so as to form hollowed-out regions which have inclined sidewalled structures which are oriented so as to open downwardly to efficiently couple light therethrough. The etching is accomplished in a particular type of silicon, i.e., that type of silicon having a <100> crystallographic orientation. It has been found that <100> crystallographically oriented silicon is etched in a preferential plane by potassium hydroxide. This invention is however not limited to silicon having this crystallographic orientation or anisotropic etchants of the potassium hydroxide variety, but is rather directed to any type crystal which, when anisotropically etched, has both inclined sidewalls whose aperture size and depth can be carefully controlled by use of the anisotropic etchant in combination with known photolithographic techniques.

SUMMARY OF THE INVENTION

It is therefore an object of this invention to provide an improved optically coupled-pair having a hollowed-out Schottky barrier detector with inclined sidewalls opening downwardly to couple in light emitted in a non-vertical direction from the light source of the coupled pair.

It is a further object of this invention to provide a hollowed-out silicon detector member for an electro-optical coupled-pair in which optical coupling takes place at inclined sidewalled apertures formed by anisotropically etching the silicon.

It is yet another object of this invention to provide the combination of an electrically controlled light source and a Schottky barrier detector, part of which partially surrounding the light source to absorb isotropically generated light.

It is a further object of this invention to provide a coupled-pair having a Schottky barrier detector prepared by a particular method of anisotropically etching a silicon wafer so as to form a silicon member whose optical coupling properties are derived from the orientation of the inclined sidewalls of apertures formed in the silicon by the anisotropic etching process.

It is yet another object of this invention to provide a crystalline Schottky barrier diode member for electro-optical coupled pairs having truncated pyramid type hollowed-out regions.

Other objects and features of this invention will become more fully apparent upon reading the following description with the accompanying drawings.

DETAILED DESCRIPTION OF THE INVENTION

The invention will be described in terms of optically coupling the outputs of light emitting diodes in that an optically more efficient light emitting device is made. It will be appreciated, however, that the subject detector is not limited to use with light emitting diodes but may be used in combination with any light emitting device. The detector referred to herein surrounds the light emitting device. The faces of the sidewalls of the detector are smooth and inclined due to anisotropic etching so that in the orientation shown, light is effectively coupled into the detector. The face of the active region of the detector is also smooth. The active region is defined to be the thin region immediately above the light source. It's thinness prevents loss of any energy which would not reach the metal semiconductor interface of the Schottky barrier diode if the distance through the semiconductive material were to be too long. The aforementioned hollowed-out regions are formed in the preferred embodiment by anisotropically etching <100> crystallographically oriented silicon. However, it will be appreciated that there are other crystal structures which may be anisotropically etched in that the etching solution attacks all crystallographic planes except those which belong to a group oriented in a given direction. This anisotropic etching aspect of the invention will be described hereinafter.

There is first described the structural configuration of the coupled-pair followed by the manner of forming the inclined sidewall hollowed-out regions by use of an anisotropic etching technique. Finally the operation of the Schottky barrier detector in combination with an isotropically radiating light source will be described.

THE COUPLED-PAIR

Figure 1:
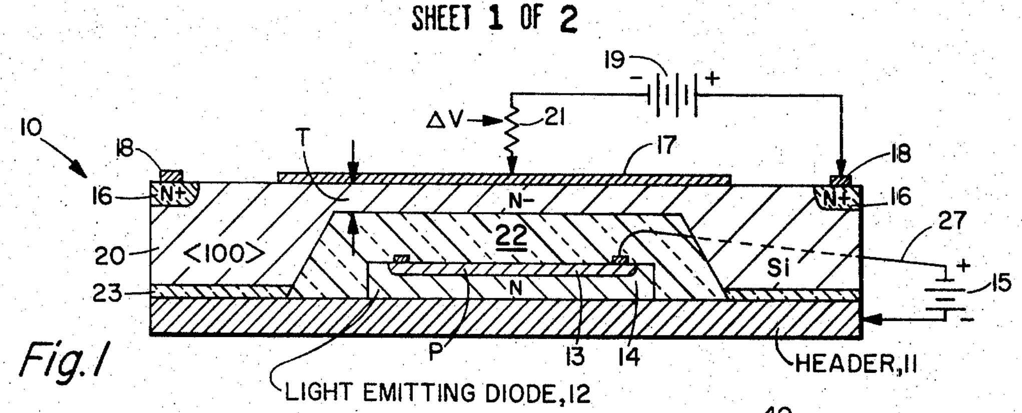
FIG. 1 is a cross-sectional diagram of the subject coupled-pair.
Figures 2A, 2B, 2C, 2D:
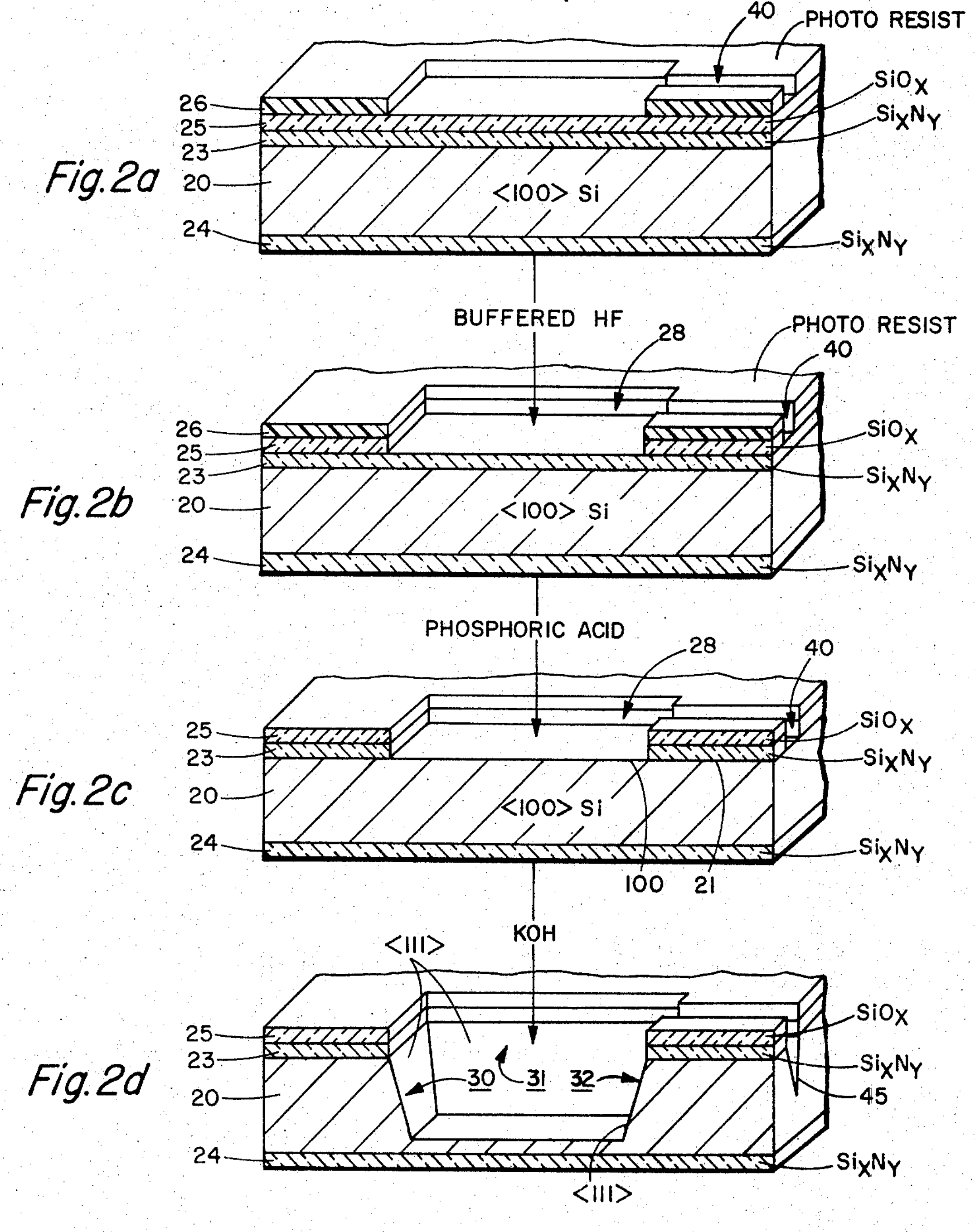
FIGS. 2*a* – 2*e* illustrate one method for anisotropically etching a silicon wafer to provide for one part of the Schottky barrier diode detector.

A coupled-pair 10 is shown in FIG. 1 to consist of a metal header 11 on which is mounted a light emitting diode of the planar diffused type in which a P-type region 13 is diffused into an N-type region 14. Such a configuration is typical of gallium phosphide and gallium arsenide light emitting diodes. The light generated by these diodes is nearly isotropic meaning that the light is emitted in all directions. Because of the metal header, downwardly propagating light is reflected upwardly. However these diodes emit a considerably amount of light in non-vertical directions. The intensity of the light generated takes on the form of a cardioid-shaped pattern such that the intensity of the light falls off towards the horizontal. The light emission characteristic is important with respect to optical coupling and the angle of the sidewalls of the aforementioned hollowed-out region. This aspect of the invention will be discussed in connection with FIG. 3. After the light emitting diode is mounted on the header 11, the main body 20 of the Schottky barrier detector is placed over the light emitting diode 12 as shown. This body 20 is a lightly doped silicon wafer having been anisotropically etched and having an insulating layer 23 between the body 20 and the header 11. As shown in this figure there may be an optical coupling material 22, such as epoxy, to more closely match the detector material to the transfer medium. If gallium arsenide light emitting diodes are used the index of refraction of the diode is $\approx 3.5$ while that of air is 1.0. Epoxy, on the other hand has an index of refraction of 1.5 which more easily couples out the light from the diode and into the silicon body 20. In the top surface of the silicon body 20 is provided a heavily doped and diffused enhancement region whose cross-sectional portions are shown by the reference character 16. The Schottky barrier is formed at the metal semiconductor interface formed between metal layer 17 and the top surface of the body 20. A contact ring shown in cross-section by the reference characters 18 is provided to the enhancement region 16. When a voltage is applied across the light emitting diode as shown by the battery 15 between the header 11 and a lead 27, which in one embodiment is passed through a V-shaped channel in the body 20 (as will be described in connection with FIGS. 2*l* – 2*e*), and if the Schottky barrier diode is reverse-biased as shown by the battery 19, then the voltage $\Delta V$ across resistor 21 will increase due to the increased current therethrough. This current is generated from the energy delivered by the photons emitted from the light emitting diode, which produce electron-hole pairs in the body 20. These pairs are separated by an electric field due to the reverse biasing such that a current flow is initiated. The production of this current will be more fully discussed in connection with FIG. 3. Here it is important to understand that the more photons captured in the body 20, the more electron-hole pairs will be generated and thus the more current generated in response to a given output from the light emitting diode.

The particular configuration of the body 20 shown, not only aids in the collection of photons because it surrounds the light source, but also allows better and more efficient coupling of the photons into the body 20. For photons emitted in the vertical direction the angle of incidence with the bottom face of the body is 0°. There is therefore no back reflection of the photons.

However there is a large amount of radiation emitted at angles between the vertical and the horizontal. The sidewalls of the hollowed-out portion of the body 20 therefore have inclinations so as to make the angle of incidence of this non-vertical radiation as close to "0" as possible. Straight sidewalls would present the horizontal radiation with a "0" angle of incidence, but the radiation in the horizontal direction is much less than radiation in, for instance, the 30° – 55° direction. It turns out that by anisotropically etching <100> crystallographically oriented silicon the sidewalls have an angle of 55° with respect to the vertical. This turns out to be optimum for collecting the majority of the non-vertical radiation from the light emitting diode. It is also the smoothness of the surfaces produced by anisotropic etching which permit good optical transfer characteristics. Further it is possible by anisotropic etching to make the thickness of the active region of the detector, T, optimal in that all of the vertically-directed photons are absorbed before they reach the semiconductor-metal interface. Yet T is not so large that there is any space for the absorbed photons to travel to reach this interface. In other words the vertical absorption distance in silicon for the particular wavelength of light emitted is what is meant by "T". For GaAs diodes emitting at ≈9,100 A the absorption distance in silicon is approximately 25 microns.

The efficiency, therefore, of the structure shown in FIG. 1 is due to the surrounding of the light source with active semiconductor material, the angles and smoothness of the sidewalls of the hollowed-out portion of body 20, and the thinness of the active thin region of body 20 accomplished by the ability to control the anisotropic etching. A description of this anisotropic etching thus follows.

ANISOTROPIC ETCHING

Referring to FIGS. *2a* – *2e* a method for masking and etching a wafer of silicon having a <100> crystallographic orientation is shown. Here a silicon wafer 20 which is lightly N doped having doping concentrations ranging from $10^{17}$ to $10^{14}$ atoms/cm$^3$ is provided with flat surfaces 21 and 22 which are coplanar with the <100> oriented crystallographic planes of the crystal. The top and bottom surfaces are thus members of the class of planes characterized as having a <100> crystallographic orientation. Crystals cut in this manner are said to have a <100> crystallographic orientation. This crystal wafer in one configuration is approximately 15 mils thick. Three-thousand angstroms of silicon nitride are deposited on surfaces of body 20 shown so as to form layers 23 and 24. Layer 23 is the first of the masking layers and layer 24 serves as a backing layer which protects the back surface from the etchant during the hot etching process. The deposition of the silicon nitride is typically in a hydrogen ambient at 950°C. After the deposition of the silicon nitride, a layer of silicon oxide, 25, is deposited over the silicon nitride layer 23. This silicon oxide layer has an approximate 5,000 A thickness. Over the top of the silicon oxide layer 25 is deposited a photoresist layer 26 which is patterned so as to form a square aperture 28 over the oxide and nitride layers and so as to form channel 40 used to produce a V-shaped channel in the body 20 for the lead 27 to the light emitting diode. The photoresist may be any commercially available photoresist such as KMER.

Thereafter as shown in FIG. *2a* the top surface of the structure thus described is subjected to a buffered hydrogen fluoride etching solution. The hydrogen fluoride attacks the silicon oxide layer 25 but does not significantly attack either the silicon nitride layer 23 or the photoresist layer 26. This etching step provides a similarly configured aperture to the aperture 28 in the photoresist 26.

The structure shown in FIG. *2b* is then subjected to a phosphoric acid etching step resulting in the structure shown in FIG. *2c*. The phosphoric acid etch removes the photoresist 26 and attacks the silicon nitride layer 23 without significantly attacking either the wafer 20 or the silicon oxide layer 25. The silicon oxide layer 25 thus serves as an etch mask for the silicon nitride leaving exposed a portion of the surface which, as described hereinbefore, lies in the <100> class of crystallographic planes.

As shown in FIG. *1c* the oxide and nitride layers 25 and 23 serve as an etch mask for the wafer 20. The structure shown in FIG. *2c* is exposed to a potassium hydroxide etching solution which operates to etch the wafer 20 in the following manner. It is a property of the potassium hydroxide etching solution that it does not attack the <111> planes of the crystal wafer 20. It will be appreciated that the class of planes belonging to the <111> class are those having a specific orientation with respect to the <100> planes. More specifically, the <111> planes are those planes oriented at an angle of approximately 55° with respect to a normal to the <100> planes. What results with a square apertured mask is a truncated pyramid type hollowed-out region shown in FIG. 2d with the larger opening corresponding to the shape and size of the aperture 28. Also formed at this time is the V-shaped channel 45. The anisotropic etchant etches through the channel aperture 40 until the two sidewalls of the channel meet, at which time the etching stops. Because of the relatively slow etching process, the depth of the etch as well as the smoothness of the sidewalls 30, 31 and 32 can be accurately controlled. It is therefore the ability to accurately control not only the aperture size, but the depth and smoothness of the surfaces 30, 31 and 32 that permit the use of anisotrpically etched silicon as a detector material. It will be further appreciated that the smaller of the openings of the truncated pyramid structure can be made to correspond exactly to the geometric size of a square light emitting device because of the accuracy of the anisotropic etching process. This accuracy of "-fit" reduces the amount of light loss when the subject detector is used in combination with light emitting devices.

After the structure shown in FIG. *2d* is formed, as shown in FIG. *2e* the layers 24 and 25 can be removed leaving a silicon wafer 20 having the aforementioned truncated pyramid type structure therein. This can be accomplished by first etching the structure in FIG. *2d* with phosphoric acid to remove the silicon nitride layer 24, followed by etching with buffered hydrogen fluoride to remove layer 25. The structure thus produced is then provided with the diffused ring 16 and the metallizations 17 and 18 by standard photolithographic techniques.

The contacts for the diode 12 are the header 11 and the wire 27 which, in one embodiment passes through the V-shaped channel 45. Shorting is sometimes a problem so the channel 45 is first coated with an insulating or oxide layer (not shown). Thereafter the lead 27 is laid in the coated channel and the channel filled with an insulating material such as epoxy.

A method of providing the aforementioned insulated or coated channel simultaneously with the formation of the truncated pyramid aperture is as follows.

Figure 2E:
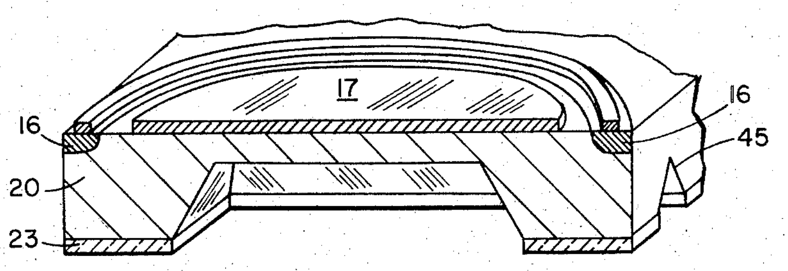

The structure shown at FIG. 2e can be turned upside-down and dipped into an insulating hardening transparent material such as epoxy to form a coating over the entire surface. The layer thus provided is then baked and the process repeated until proper insulation thickness is achieved. It will not matter that the whole structure is coated with epoxy if an epoxy cavity fill such as that shown at 22 in FIG. 1 is used. However a solder glass may be silk screened on appropriate areas in a thickness of 1 – 2 mils which is then fired at a low temperature.

A drawback to the epoxy dip method described is that the structure cannot then be subjected to high temperatures such as would exist in die bonding.

Alternately no epoxy is formed on the structure of FIG. 2e. Simple care in wire bonding can insure that the lead 27 of FIG. 1 is not touching the sides of the V-shaped channel. Although this procedure would seem difficult it is not overly so because the channel is usually 6 mils wide at the top with wire having diameters of less than 1 mil being positioned in the channel. After the lead 27 is in place the channel can be filled with any insulating material such as a sputtered oxide of silicon which can withstand die bonding heats.

Figure 3:
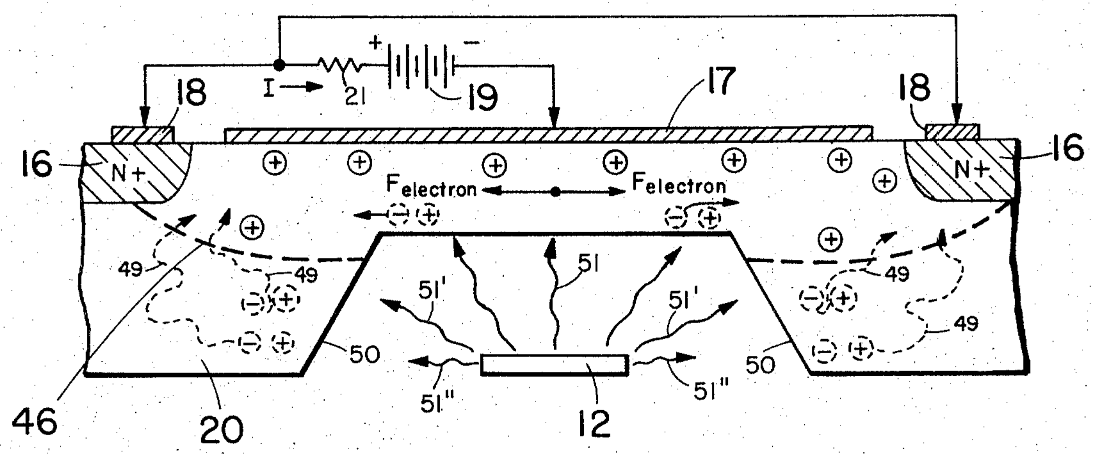
FIG. 3 is a diagram indicating the Schottky diode detection process indicating electron-hole pairs generated both inside and outside of the depletion region caused by reverse biasing the Schottky barrier diode junction.

Referring to FIG. 3 the operation of the detector is described in schematic form. When a reverse-biasing voltage such as that shown at 19 is applied across contacts 17 and 18 an electric field is set up in the body 20. This field extends downwardly from the top surface of body 20 and terminates laterally at the contact diffusion ring 16. The field causes the region bounded by the dotted line 46 to be depleted of electrons, and to have a positive charge. After electron depletion there still exists in this depletion region an electric field creating a force of any further electrons. This force is denoted by the arrows labelled "$F_{electron}$". When energy $h\sigma$ in the form of photons from the light source 12 passes through body 20, electron-hole pairs are formed. In the depletion region force-field the electrons are accelerated towards regions 16. The sweep of the electrons causes a current I through resistor 21 as shown. If body 20 were not hollowed out the electron pairs generated in the depletion region would be the only pairs contributing to the current I. However the efficiency of coupled-pairs utilizing Schottky barrier diodes can be significantly increased by hollowing out the body 20 as hereinbefore described. Non-vertical radiation from source 12 causes electron hole pairs to be generated in the regions under the depletion region. As these pairs migrate randomly as shown by the dotted lines 49. Some of them reach the depletion region where they contribute to the current I and thus to the efficiency of the detector.

The efficiency of the detector is further increased by the inclination of the sidewalls 50. If source 12 is a gallium arsenide light emitting diode the majority of the light is emitted vertically as shown by arrow 51. The intensity of the light emitted falls off as shown by the length of the arrows 51' and 51'' in non-vertical directions towards the horizontal. Since more light is emitted in the directions shown by arrows 51' than in directions shown by arrows 51'', it is more important that this 51' light be coupled efficiently into body 20. Further, the amount of time that electron-hole pairs generated by this 51' light takes to get to the depletion region is less than those generated by horizontally emitted light 51''. This is because of the greater distance that electron-hole pairs generated by horizontally emitted light must travel before they reach the depletion region. It is important, in order to reduce the response time of coupled-pairs, that the 51' light rather than the 51'' light be coupled efficiently into body 20. The 55° angle of sidewalls 50 ensures that the 51' light is efficiently coupled into body 20. This is because the critical angle at which reflection takes place is never reached by any significant amount of light emanating from source 12. Thus anisotropic etching of the body 20 couples the majority of intense photons efficiently either into the depletion region or the areas immediately under the depletion region thereby stimulating more electron-hole pairs and more current, I.

CONCLUSION

There has therefore been provided a coupled-pair with a Schottky barrier detector in which the body of the detector has been anisotropically etched to provide smooth inclined sidewalls for light gathering and optical coupling purposes and a narrow region which is accurately controlled by anisotropic etching techniques.

What is claimed is:

1. An electro-optical coupled-pair comprising:
a light source; and
a Schottky barrier detector, said detector including a lightly doped semiconductor wafer having a hollowed-out region characterized by outwardly and downwardly flared inclined smooth sidewalls and a flat smooth portion parallel to the top surface of said wafer, said wafer being positioned over said light source, said detector further including a metal layer on top of said top surface in vertical spaced adjacency to said flat smooth portion of said hollowed-out region, and means encircling said metal layer and spaced therefrom on said top surface for making ohmic contact to said wafer, whereby isotropically emitted light from said light source is collected by said wafer and effectively coupled into said detector for the production of electron-hole pairs.

2. The coupled-pair as recited in claim 1 wherein said hollowed-out region is formed by anisotropically etching said wafer.

3. The coupled-pair as recited in claim 2 wherein said wafer is silicon having a <100> crystallographic orientation, and wherein said anisotropic etchant attacks all planes except the <111> planes of said crystal, whereby the angle of inclination of said sidewalls optimally couples energy into said wafer.

4. The coupled-pair as recited in claim 1 wherein said light source is a light emitting diode.

5. The coupled-pair as recited in claim 4 wherein said light emitting diode is a planar diffused gallium arsenide light emitting diode.

6. The coupled-pair as recited in claim 1 wherein any space between said light source and said detector is filled with a hard transparent optical coupling material.

7. The coupled-pair as recited in claim 6 wherein said optical coupling material is an epoxy.

8. The coupled-pair as recited in claim 1 wherein said hollowed-out region is in the form of a truncated pyramid formed by anisotropically etching said wafer.

9. The coupled-pair as recited in claim 8 wherein said wafer includes a V-shaped channel communicating at one end with said hollowed-out region and at its other end exteriorly to said wafer, said channel having been formed in the same anisotropic etching step used in the formation of said truncated pyramid, said channel adapted to carry contact leads to said light source.

* * * * *